(12) United States Patent
Park et al.

(10) Patent No.: US 7,544,597 B2
(45) Date of Patent: Jun. 9, 2009

(54) METHOD OF FORMING A SEMICONDUCTOR DEVICE INCLUDING AN OHMIC LAYER

(75) Inventors: Hee-Sook Park, Seoul (KR); Gil-Heyun Choi, Gyeonggi-do (KR); Chang-Won Lee, Gyeonggi-do (KR); Byung-Hak Lee, Gyeonggi-do (KR); Sun-Pil Youn, Seoul (KR); Dong-Chan Lim, Seoul (KR); Jae-Hwa Park, Gyeonggi-do (KR); Jang-Hee Lee, Seoul (KR); Woong-Hee Sohn, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 438 days.

(21) Appl. No.: 11/332,476

(22) Filed: Jan. 17, 2006

(65) Prior Publication Data

US 2006/0180875 A1 Aug. 17, 2006

(30) Foreign Application Priority Data

Jan. 17, 2005 (KR) .................. 10-2005-0004196

(51) Int. Cl.
*H01L 21/44* (2006.01)
(52) U.S. Cl. .................. 438/592; 438/649; 438/656; 438/683; 257/E21.168
(58) Field of Classification Search .................. 438/679
See application file for complete search history.

(56) References Cited

U.S. PATENT DOCUMENTS 5,030,588 A * 7/1991 Hosaka .................. 438/384
6,037,263 A * 3/2000 Chang .................. 438/712
6,306,743 B1 10/2001 Lee

FOREIGN PATENT DOCUMENTS

| EP | 648859 A1 * | 4/1995 |
|---|---|---|
| KR | 10-0214906 | 5/1999 |
| KR | 2001-80635 | 8/2001 |
| KR | 10-0351907 | 8/2002 |
| KR | 1020030048205 A | 6/2003 |

OTHER PUBLICATIONS

Korean Office Action dated Apr. 26, 2006.

* cited by examiner

*Primary Examiner*—Stephen W Smoot
(74) *Attorney, Agent, or Firm*—Harness, Dickey & Pierce, P.L.C.

(57) ABSTRACT

In an ohmic layer and methods of forming the ohmic layer, a gate structure including the ohmic layer and a metal wiring having the ohmic layer, the ohmic layer is formed using tungsten silicide that includes tungsten and silicon with an atomic ratio within a range of about 1:5 to about 1:15. The tungsten silicide may be obtained in a chamber using a reaction gas including a tungsten source gas and a silicon source gas by a partial pressure ratio within a range of about 1.0:25.0 to about 1.0:160.0. The reaction gas may have a partial pressure within a range of about 2.05 percent to about 30.0 percent of a total internal pressure of the chamber. When the ohmic layer is employed for a conductive structure, such as a gate structure or a metal wiring, the conductive structure may have a reduced resistance.

20 Claims, 6 Drawing Sheets

METHOD OF FORMING A SEMICONDUCTOR DEVICE INCLUDING AN OHMIC LAYER

PRIORITY STATEMENT

This application claims priority under 35 USC § 119 to Korean Patent Application No. 2005-0004196 filed on Jan. 17, 2005, the entire contents of which are incorporated herein by reference.

BACKGROUND OF THE INVENTION

1. Field of the Invention

Example embodiments of the present invention relate to an ohmic layer, a method of forming an ohmic layer, a semiconductor device including an ohmic layer and a method of forming a semiconductor device including an ohmic layer. More particularly, example embodiments of the present invention relate to an ohmic layer reducing a resistance between silicon and metal, which may be used in a semiconductor device.

2. Description of the Related Art

As semiconductor devices have become highly integrated, sizes of patterns of semiconductor devices have been decreased and intervals among the patterns have been reduced. When conductive patterns, for example, gate electrodes and/or bit lines have reduced sizes, resistances of the conductive patterns may increase.

Polysilicon doped with impurities may be used for a conventional conductive pattern such as a gate electrode. However, a conductive pattern of doped polysilicon may not be employed in a highly integrated semiconductor device having a high response speed because the reduced size of the conductive pattern of doped polysilicon may cause the conductive pattern of doped polysilicon to have a relatively high resistance.

Therefore, a polycide structure was developed for forming a conductive pattern because the conductive pattern of a polycide structure may have a resistance lower than that of a conductive pattern of doped polysilicon. Conventionally, a polycide structure may include a doped polysilicon film and a refractory metal silicide film, for example, a tungsten silicide film formed on a doped polysilicon film. However, a conductive pattern of a polycide structure may not be employed in a conventional semiconductor device requiring an exceedingly low resistance, although the conductive pattern of the polycide structure has the low resistance.

Considering the above-mentioned problem, a conductive pattern including a polysilicon film and a metal film has been developed for a conventional semiconductor device. However, a metal film of a conductive pattern may be easily silicided in a formation of the metal film on a polysilicon film, so a barrier layer may be formed between the polysilicon film and the metal film in order to reduce a silicidation reaction between the polysilicon film and the metal film. Further, an ohmic layer may be formed between a polysilicon film and a metal film to reduce a total resistance of a conductive pattern.

An ohmic layer is generally formed between a metal wiring and a silicon layer or a silicon substrate when a metal wiring is formed on a substrate. For example, a prior art method of forming a gate electrode may include a polysilicon layer pattern and a tungsten layer pattern. In particular, a prior art gate electrode may include a polysilicon layer pattern, a tungsten silicide layer pattern, a diffusion barrier layer pattern and the tungsten layer pattern. A tungsten silicide layer pattern of the prior art gate electrode may include tungsten and silicon with an atomic ratio in a range of about 1:2 to about 1:3.

When a tungsten silicide layer pattern having tungsten and silicon by the atomic ratio in the range of about 1:2 to about 1:3 is formed between a polysilicon layer pattern and a tungsten layer pattern, however, ingredients in a diffusion barrier layer pattern may be easily decomposed in a succeeding thermal process so that the tungsten layer pattern may be easily silicided, and then the tungsten layer pattern may be converted into a silicide layer pattern. When a tungsten layer pattern is converted into a silicide layer pattern, a gate electrode may not have a desired low resistance. Additionally, a volume of a tungsten layer pattern is reduced when the tungsten silicide layer pattern is silicided so that a void may be generated at an interface between a polysilicon layer pattern and a tungsten silicide layer pattern.

SUMMARY OF THE INVENTION

Example embodiments of the present invention provide an ohmic layer. The ohmic layer may reduce an interface resistance between two layers including materials different from each other.

Example embodiments of the present invention provide a method of forming an ohmic layer. The ohmic layer may reduce an interface resistance between two layers including materials different from each other.

Example embodiments of the present invention provide a gate structure having an ohmic layer. The ohmic layer of the gate structure may reduce an interface resistance between two layers including materials different from each other.

Example embodiments of the present invention provide a method of forming a gate structure having an ohmic layer. The ohmic layer of the gate structure may reduce an interface resistance between two layers including materials different from each other.

Example embodiments of the present invention provide a metal wiring having an ohmic layer. The ohmic layer of the metal wiring may reduce an interface resistance between two layers including materials different from each other.

Example embodiments of the present invention provide a method of forming a metal wiring having an ohmic layer. The ohmic layer of the metal wiring may reduce an interface resistance between two layers including materials different from each other.

An example embodiment of the present invention provides an ohmic layer in a semiconductor device. The ohmic layer may include a tungsten silicide layer that includes tungsten and silicon with an atomic ratio within a range of about 1:5 to about 1:15.

An example embodiment of the present invention provides a method of forming an ohmic layer in a semiconductor device. The method may include forming a tungsten silicide layer on a substrate. The tungsten silicide layer may include tungsten and silicon with an atomic ratio within a range of about 1:5 to about 1:15.

BRIEF DESCRIPTION OF THE DRAWINGS

Example embodiments of the present invention will be more clearly understood from the description of example embodiments of the present invention, taken in conjunction with the accompanying drawings. The drawings are not necessarily to scale, emphasis instead being placed upon illustrating the principles of the invention.

DESCRIPTION OF EXAMPLE EMBODIMENTS

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout the figures. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes", "comprises", "including" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of example embodiments (and intermediate structures) of the present invention. As such, variations from the shapes of the illustrations as a result, of manufacturing techniques and/or tolerances, for example, are to be expected. Thus, example embodiments of the present invention should not be construed as limited to the particular shapes of regions illustrated herein and are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation, for example, may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A resistance reduction layer (hereinafter, referred to as "an ohmic layer") according to an example embodiment of the present invention may have a tungsten silicide layer that includes tungsten and silicon with an atomic ratio in a range of about 1:5 to about 1:15. Further, the atomic ratio of tungsten and silicon in the ohmic layer of tungsten silicide according to an example embodiment of the present invention may be within a range of about 1:7 to about 11:10.

In some example embodiments of the present invention, a tungsten silicide layer serving as the ohmic layer may be obtained in a chamber using a reaction gas that includes a tungsten source gas and a silicon source gas by a partial pressure ratio within a range of about 1.0:25.0 to about 1.0:160.0. Further, the reaction gas may have a partial pressure within a range of about 2.05 percent to about 30.0 percent of a total internal pressure of the chamber.

In some example embodiments of the present invention, the tungsten silicide layer may be obtained by a sputtering process using a tungsten silicide target that includes tungsten and silicon with an atomic ratio within a range of about 1:5 to about 1:15.

In a method of forming an ohmic layer including tungsten silicide according to an example embodiment of the present invention, after a substrate is loaded into a chamber, a tungsten silicide layer is formed on the substrate as the ohmic layer. The tungsten silicide layer may include tungsten and silicon with an atomic ratio within a range of about 1:5 to about 1:15

In a process for forming a tungsten silicide layer according to an example embodiment of the present invention, a reaction gas including tungsten and silicon source gases may be introduced into a chamber. The reaction gas may have a partial pressure within a range of about 2.05 percent to about 30.0 percent of the total internal pressure of the chamber. A partial pressure ratio between the tungsten source gas and the silicon source gas in the reaction gas may be within a range of about 1.0:25.0 to about 1.0:160.0.

In example embodiments of the present invention, a tungsten source gas may include tungsten fluoride ($WF_6$), for example. A silicon source gas may include dichlorosilane ($SiH_2Cl_2$; DCS) or silane ($SiH_4$), for example.

In example embodiments of the present invention, an inert gas may be introduced into a chamber to carry a reaction gas and/or to adjust process conditions for forming a tungsten silicide layer in the chamber. The inert gas may have a partial pressure within a range of about 70 percent to about 97.95 percent of a total internal pressure of the chamber.

According to an example embodiment of the present invention, a chamber may have a total internal pressure within a range of about 0.5 Torr to about 5.0 Torr. According to another example embodiment of the present invention, a total internal pressure of the chamber is within a range of about 0.5 Torr to about 1.5 Torr.

In example embodiments of the present invention, a tungsten silicide layer serving as an ohmic layer may be obtained by a physical vapor deposition (PVD) process, for example, a sputtering process using a target that includes tungsten and silicon with an atomic ratio within a range of about 1:5 to about 1:15.

Figure 1:
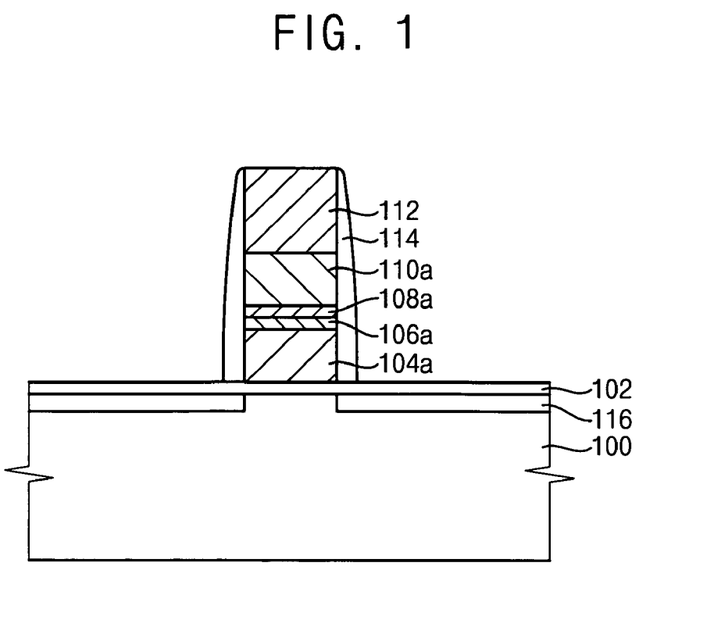
FIG. 1 is a cross-sectional view illustrating a transistor including an ohmic layer pattern in accordance with an example embodiment of the present invention.

FIG. 1 is a cross-sectional view illustrating a transistor including an ohmic layer pattern in accordance with an example embodiment of the present invention.

Referring to FIG. 1, a transistor may include a gate insulation layer 102 formed on a substrate 100. An active region and a field region may be defined on a substrate 100 by an isolation process, for example, a shallow trench isolation (STI) process.

The gate insulation layer 102 may include an oxide, for example, silicon oxide. Alternatively, the gate insulation layer 102 may include a material having a dielectric constant substantially higher than that of silicon oxide. For example, the gate insulation layer 102 may include, but is not limited to, $HfO_2$, $ZrO_2$, $Ta_2O_5$, $Y_2O_3$, $Nb_2O_5$, $Al_2O_3$, $TiO_2$, $CeO_2$, $In_2O_3$, $RuO_2$, $MgO$, $SrO$, $B_2O_3$, $SnO_2$, $PbO$, $PbO_2$, $Pb_3O_4$, $V_2O_3$, $La_2O_3$, $Pr_2O_3$, $Sb_2O_3$, $Sb_2O_5$, $CaO$, etc., or mixtures thereof.

A transistor according to an example embodiment of the present invention may include a conductive structure, for example, a gate structure that has a polysilicon layer pattern 104a, a tungsten silicide layer pattern 106a, a barrier layer pattern 108a and a tungsten layer pattern 110a sequentially formed on the gate insulation layer 102. The polysilicon layer pattern 104a may correspond to a first conductive layer pattern and a tungsten layer pattern 110a may correspond to a second conductive layer pattern. A transistor may also include a hard mask pattern 112 formed on the tungsten layer pattern 110a. Further, a transistor may include a spacer 114 formed on a sidewall of the gate structure and a sidewall of the hard mask pattern 112.

P type impurities or N type impurities may be doped in the polysilicon layer pattern 104a When the transistor is a P type transistor, the P type impurities are doped in the polysilicon layer pattern 104a. The N type impurities are doped in the polysilicon layer pattern 104a when the transistor is an N type transistor.

According to an example embodiment of the present invention, the tungsten silicide layer pattern 106a may enhance adhesion strength between the polysilicon layer pattern 104a and the tungsten layer pattern 110a. The tungsten silicide layer pattern 106a serves as an ohmic layer pattern (that is, a resistance reduction layer pattern) that may reduce a contact resistance between the polysilicon layer pattern 104a and the tungsten layer pattern 110a. The tungsten silicide layer pattern 106a may include tungsten and silicon with an atomic ratio within a range of about 1:5 to about 1:15. The tungsten silicide layer pattern 106a may have a thickness of about 30 Å to about 200 Å.

The tungsten silicide layer pattern 106a may be formed under process conditions so that a silicidation reaction between the tungsten layer pattern 110a and the polysilicon layer pattern 104a may be reduced and/or prevented in succeeding processes, for example, a process of forming the barrier layer 108a, a process of forming the tungsten layer pattern 110a and a thermal process for forming the transistor. According to an example embodiment of the present invention, an atomic ratio of tungsten and silicon included in the tungsten silicide layer pattern 106a may be adjusted and a thickness of the tungsten silicide layer pattern 106a may be controlled to reduce and/or prevent the above-mentioned silicidation reaction.

In an example embodiment of the present invention, because a silicidation process may be caused by a partial thermal decomposition of ingredients in the barrier layer pattern 108a in a succeeding thermal process, a content of silicon included in the tungsten silicide layer pattern 106a may be increased to reduce and/or minimize the thermal decomposition of ingredients in the barrier layer pattern 108a. However, a gate electrode including a tungsten silicide layer pattern 106a may have an undesirably large resistance when the content of silicon in the tungsten silicide layer pattern 106a is excessively increased. The content of silicon in the tungsten silicide layer pattern 106a may be adjusted so the atomic ratio of tungsten and silicon in the tungsten silicide layer pattern 106a may be in a range of about 1:5 to about 1:15 to reduce and/or prevent a silicidation reaction and an increase of the resistance of the gate electrode. For example, the tungsten silicide layer pattern 106a may be adjusted to include tungsten and silicon with an atomic ratio within a range of about 1:7 to about 1:10.

Further, the barrier layer pattern 108a may be damaged in a succeeding thermal process. The damage is at least partly related to a thickness of the tungsten silicide layer pattern 106a For example, a thinner tungsten silicide layer pattern 106a may reduce and/or minimize a silicidation reaction between the polysilicon layer pattern 104a and the tungsten layer pattern 110a. When the tungsten silicide layer pattern 106a has a thickness of above about 200 Å, most of the tungsten in the tungsten layer pattern 110a may be silicided in the succeeding thermal process because the barrier layer pattern 108a is damaged. Thus, according to an example embodiment of the present invention, the tungsten silicide layer pattern 106a may have a thickness less than about 200 Å. Conversely, a resistance of the gate electrode may increased because the tungsten silicide layer pattern 106a may not properly serve as the ohmic layer pattern if the tungsten silicide layer pattern 106a has a thickness less than about 30 Å. Therefore, according to an example embodiment of the present invention, the tungsten silicide layer pattern 106a may have a thickness in a range of about 30 Å to about 200 Å.

In an example embodiment of the present invention, the tungsten silicide layer pattern 106a may be formed on the polysilicon layer pattern 104a in a chamber using a reaction gas including a tungsten source gas and a silicon source gas. The tungsten source gas and the silicon source gas may be provided onto the polysilicon layer pattern 104a by a partial pressure ratio within a range of about 1.0:25.0 to about 1.0:160.0. Further, the reaction gas may be introduced into the chamber to adjust an internal pressure of the chamber. For example, the reaction gas may have a partial pressure within a range of about 2.05 percent to about 30.0 percent of the internal pressure in the chamber.

In an example embodiment of the present invention, the tungsten silicide layer pattern 106a may be formed by a sputtering process using a tungsten silicide target that includes tungsten and silicon with an atomic ratio within a range of about 1:5 to about 1:15.

Referring now to FIG. 1, the barrier layer pattern 108a may include a metal nitride. The barrier layer pattern 108a may reduce and/or prevent diffusion of tungsten included in the tungsten layer pattern 110a. For example, the barrier layer pattern 108a may include tungsten nitride, titanium nitride, tantalum nitride, boron nitride, etc.

The hard mask pattern 112 may include a nitride, for example, silicon nitride. As shown in FIG. 1, the spacer 114 may extend from the gate insulation layer 102 to a sidewall of the hard mask pattern 112.

The transistor may also include source/drain regions 116 formed at portions of the substrate 100 adjacent to the gate electrode.

As described above, a gate electrode according to an example embodiment of the present invention may have a reduced resistance because the gate electrode includes an ohmic layer pattern, for example, the tungsten silicide layer pattern 106a and a conductive layer pattern, for example, the tungsten layer pattern 110a. Further, the tungsten layer pattern 110a of the gate electrode may not be silicided due to the tungsten silicide layer pattern 106a interposed between the tungsten layer pattern 110a and the polysilicon layer pattern 104a because the tungsten silicide layer pattern 106a has a properly adjusted thickness and includes tungsten and silicon by the atomic ratio within a range of about 1:5 to about 1:15.

FIGS. 2 to 5 are cross-sectional views illustrating a method of manufacturing a transistor in accordance with an example embodiment of the present invention.

Figure 2:
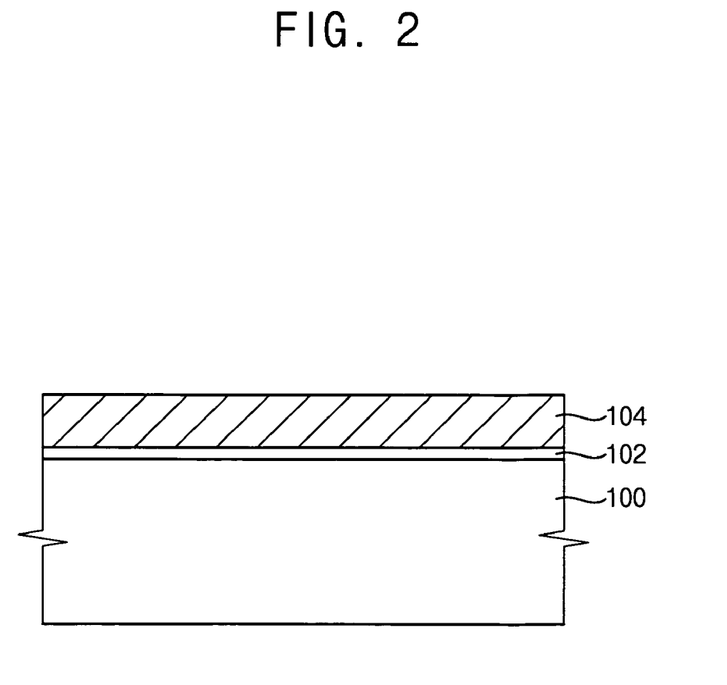
FIGS. 2 to 5 are cross-sectional views illustrating a method of manufacturing a transistor in accordance with an example embodiment of the present invention.

Referring to FIG. 2, an active region and a field region may be defined on a semiconductor substrate 100 through an isolation process.

A gate insulation layer 102 may be formed on a substrate 100. The gate insulation layer 102 including silicon oxide may be formed on the substrate 100 by a thermal oxidation process. Alternatively, the gate insulation layer 102 may be formed on the substrate 100 including a material having a high dielectric constant by a chemical-vapor deposition (CVD) process, an atomic layer deposition (ALD) process, a sputtering process, a high-density plasma chemical-vapor deposition (HDP-CVD) process, etc.

A polysilicon layer 104 may be formed on the gate insulation layer 102 positioned on the substrate 100 as a first conductive layer. The polysilicon layer 104 may be doped with P type impurities and/or N type impurities using a diffusion process, an ion implantation process, an in-situ doping process, etc.

In an example embodiment of the present invention, the polysilicon layer 104 may be doped with the P type impurities, for example, boron (B), boron fluoride ($BF_2$) and/or indium (In) when a transistor is a P type transistor.

In another example embodiment of the present invention, the polysilicon layer 104 may be doped with the N type impurities, for example, phosphorus (P) and/or arsenic (As) when the transistor is an N type transistor.

Figure 3:
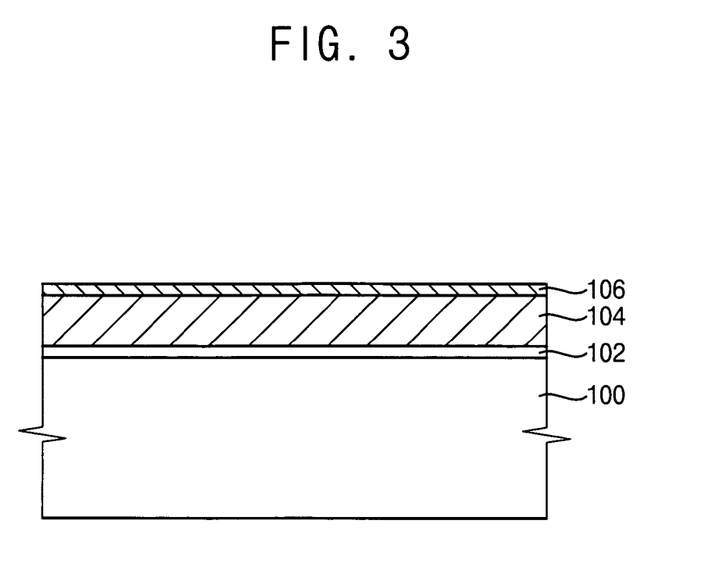

As to FIG. 3, a tungsten silicide layer 106 may be formed on the polysilicon layer 104. The tungsten silicide layer 106 serves as an ohmic layer that reduces a resistance of a gate electrode of the transistor. According to an example embodiment of the present invention, the tungsten silicide layer 106 may include tungsten and silicon with an atomic ratio within a range of about 1:5 to about 1:15. According to another example embodiment of the present invention, an atomic ratio between tungsten and silicon in the tungsten silicide layer 106 may be within a range of about 1:7 to about 1:10.

The tungsten silicide layer 106 according to an example embodiment of the present invention may have a thickness within a range of about 30 Å to about 200 Å. According to another example embodiment of the present invention, a thickness of the tungsten silicide layer 106 may be within a range of about 50 Å to about 100 Å. The tungsten silicide layer 106 may be formed by a CVD process, an ALD process, an HDP-CVD process, a sputtering process, an evaporation process, a PLD process, etc.

In an example embodiment of the present invention, the tungsten silicide layer 106 may be formed by a CVD process. In a CVD process forming the tungsten silicide layer 106, the substrate 100 having the polysilicon layer 104 thereon is loaded into a chamber of a chemical-vapor deposition apparatus. A reaction gas including a tungsten source gas and a silicon source is introduced into the chamber. The reaction gas may have a partial pressure within a range of about 2.05 percent to about 30.0 percent of a total internal pressure of the chamber. Additionally, the tungsten source gas may have a partial pressure sufficiently lower than that of the silicon source gas to form the tungsten silicide layer 106 that includes tungsten and silicon with an atomic ratio within a range of about 1:5 to about 1:15.

If a partial pressure ratio between the tungsten source gas and the silicon source gas is too low, a content of tungsten in the tungsten silicide layer 106 may exceed a previously set content of tungsten in the tungsten silicide layer 106 and as a result, the tungsten silicide layer 106 may not effectively serve as an ohmic layer. Further, if a partial pressure ratio between the tungsten source gas and the silicon source gas is too large, a content of silicon in the tungsten silicide layer 106 may exceed a previously set content of silicon in the tungsten silicide layer 106 and as a result, the tungsten silicide layer 106 may not have a composition suitable for acting as the ohmic layer. According to an example embodiment of the present invention, a partial pressure ratio between the tungsten source gas and the silicon source gas is in a range of about 1.0:25.0 to about 1.0:160.0. According to another example embodiment of the present invention, a partial pressure ratio between the tungsten source gas and the silicon source gas may be in a range of about 1.0:25.0 to about 1.0:30.0.

In an example embodiment of the present, the tungsten source gas may include tungsten fluoride ($WF_6$) and the silicon source gas may include dichlorosilane ($SiH_2Cl_2$; DCS) or silane ($SiH_4$), for example.

In an example embodiment of the present invention, an inert gas may be introduced into the chamber as a carrier gas to transport a reaction gas into the chamber and to control the total internal pressure of the chamber. For example, the inert gas may have a partial pressure in a range of about 70 percent to about 97.95 percent of the total internal pressure in the chamber. The inert gas may include an argon (Ar) gas, a helium (He) gas, a nitrogen ($N_2$) gas, etc.

In an example embodiment of the present invention, a chamber may have a total internal pressure in a range of about 0.5 Torr to about 5.0 Torr, while a CVD process for forming the tungsten silicide layer 106 is performed. According to an example embodiment of the present invention, a total internal pressure of the chamber may be in a range of about 0.5 Torr to about 1.5 Torr.

In an example embodiment of the present invention, the tungsten silicide layer 106 may be formed by a physical vapor deposition (PVD) process, for example, a sputtering process using a target that includes tungsten and silicon with an atomic ratio in a range of about 1:5 to about 1:15.

Figure 4:
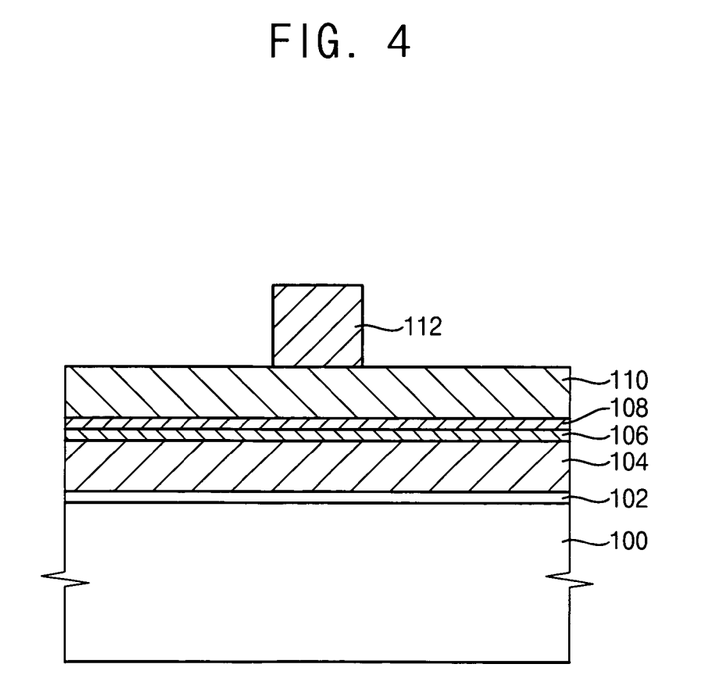

Referring to FIG. 4, a barrier layer 108 may be formed on the tungsten silicide layer 106. The barrier layer 108 may reduce and/or prevent diffusion of metal atoms in succeeding processes. The barrier layer 108 may be formed using a nitride, for example, tungsten nitride, titanium nitride, tantalum nitride, boron nitride, etc. Further, the barrier layer 108 may be formed by a CVD process, an ALD process, a sputtering process, an evaporation process, a PLD process, etc. The barrier layer 108 may have a resistance substantially higher than that of a tungsten layer 110 succeedingly formed on the barrier layer 108. A thickness of the barrier layer 108 may be reduced and/or minimized to a thickness that sufficiently reduces and/or prevents the diffusion of the metal atoms. According to an example embodiment of the present invention, the barrier layer 108 has a thickness in a range of about 30 Å to about 100 Å.

The tungsten layer 110 may be formed on the barrier layer 108 as a second conductive layer. According to an example embodiment of the present invention, the tungsten layer 110 may have a thickness in a range of about 200 Å to about 800 Å measured from an upper face of the barrier layer 108. The tungsten layer 110 may be formed by a CVD process or a PVD process.

A hard mask layer (not shown) may be formed on the tungsten layer 110. The hard mask layer may be formed using a nitride, for example, silicon nitride. The hard mask layer may be patterned by a photolithography process to form a hard mask pattern 112 on the tungsten layer 110.

Figure 5:
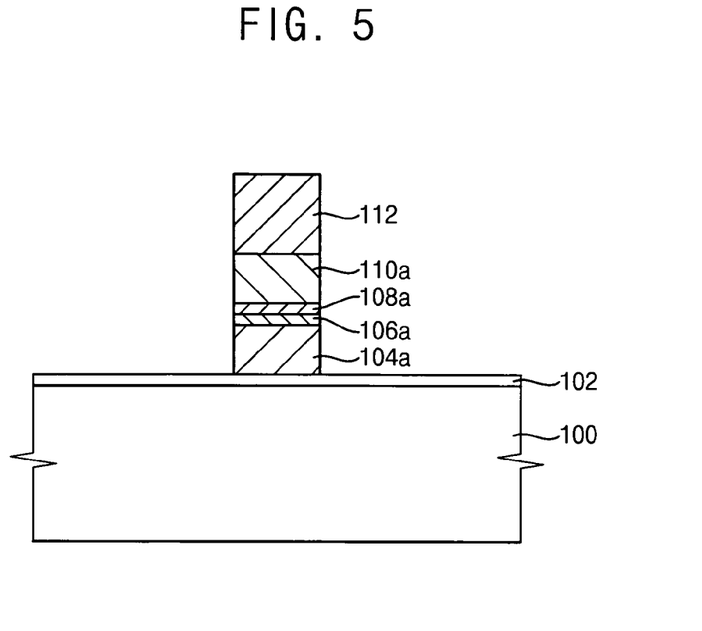

Referring to FIG. 5, the tungsten layer 110, the barrier layer 108, the tungsten silicide layer 106 and the polysilicon layer 104 may be sequentially etched using the hard mask pattern 112 as an etching mask to form a polysilicon layer pattern 104a, a tungsten silicide layer pattern 106a, a barrier layer pattern 108a and a tungsten layer pattern 110a on the gate insulation layer 102. The gate insulation layer 102, the polysilicon layer pattern 104a, the tungsten silicide layer pattern 106a, the barrier layer pattern 108a, the tungsten layer pattern 110a and the hard mask pattern 112 may be collectively referenced to as a gate structure.

In an example embodiment of the present invention, a sidewall of the gate structure may be selectively oxidized at a temperature in a range of about 800° C. to about 1,000°. This thermal oxidation process is often referred to as a re-oxidation process. In a re-oxidation process for the gate structure according to an example embodiment of the present invention, the tungsten layer pattern 110a and the tungsten silicide layer pattern 106a are not oxidized.

As described above, the tungsten layer pattern 110a may not react with the polysilicon layer pattern 104a when a temperature greater than about 800° C. is used in a thermal process for example, the re-oxidation process because the tungsten silicide layer pattern 106a including tungsten and silicon by the atomic ratio in a range of about 1:5 to about 1:15 may effectively reduce and/or prevent a silicidation reaction between the tungsten layer pattern 110a and the polysilicon layer pattern 104a. Accordingly, an electrical defect in a gate structure, for example, an excessive increase of resistance due to an undesired silicide layer pattern may be avoided because the tungsten layer pattern 110a may not be converted to an undesired silicide layer pattern. Therefore, the gate structure according to an example embodiment of the present invention may have improved electrical characteristics.

According to an example embodiment of the present invention, after a spacer 114 (see FIG. 1) is formed on the sidewall of the gate structure, source/drain regions 116 (see FIG. 1) may be formed at portions of the substrate 100 adjacent to the gate structure, thereby forming a transistor on the substrate 100.

Figure 6:
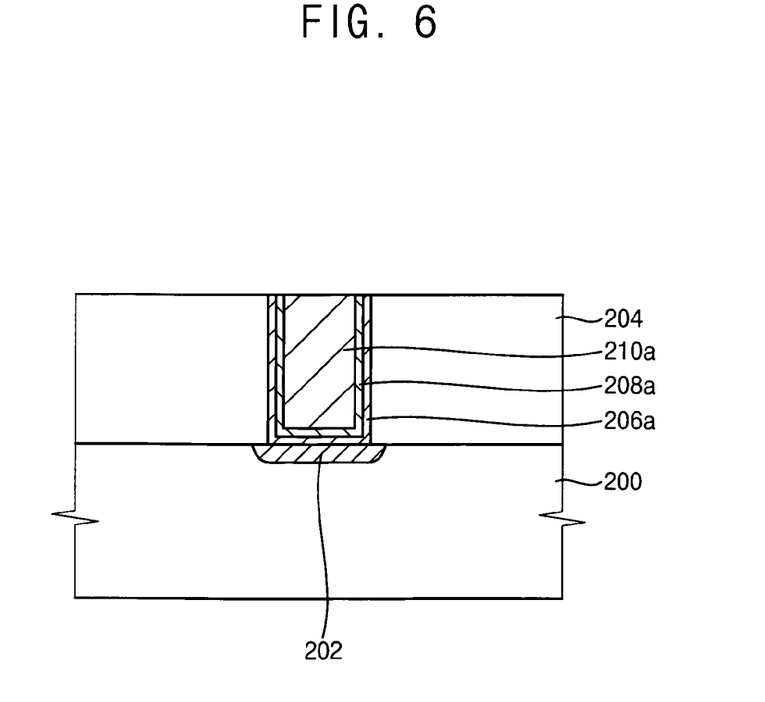
FIG. 6 is a cross-sectional view illustrating a metal wiring including an ohmic layer in accordance with an example embodiment of the present invention.

FIG. 6 is a cross-sectional view illustrating a metal wiring including an ohmic layer in accordance with an example embodiment of the present invention.

Referring to FIG. 6, an insulation layer 204 or an insulating interlayer may be formed on a substrate 200. A contact hole (not shown) may be formed through the insulation layer 204 to expose a portion of the substrate 200. The contact hole may expose a contact region formed at an upper portion of the substrate 200. The contact region of the substrate 200 may be formed by doping P type impurities or N type impurities.

A metal wiring may include a tungsten silicide layer pattern 206a formed on a sidewall and on a bottom face of the contact hole. The tungsten silicide layer pattern 206a serves as an ohmic layer pattern that reduces a contact resistance between the contact region and a conductive layer pattern formed on the tungsten silicide layer pattern 206a The tungsten silicide layer pattern 206a may include tungsten and silicon with an atomic ratio in a range of about 1:5 to about 1:15. For example, the tungsten silicide layer pattern 206a may include tungsten and silicon with an atomic ratio of about 1:7 to about 1:10. The tungsten silicide layer pattern 206a may have a thickness in a range of about 30 Å to about 200 Å.

In an example embodiment of the present invention, the tungsten silicide layer pattern 206a may be formed in a chamber using a reaction gas that includes a tungsten source gas and a silicon source gas by a partial pressure ratio in a range of about 1.0:25.0 to about 1.0:160.0. The reaction gas may have a partial pressure in a range of about 2.05 percent to about 30.0 percent of a total internal pressure in the chamber.

In another example embodiment of the present invention, the tungsten silicide layer pattern 206a may be formed by a sputtering process using a tungsten silicide target that includes tungsten and silicon with an atomic ratio in a range of about 1:5 to about 1:15.

The metal wiring according to an example embodiment of the present invention may include a barrier layer pattern 208a formed on the tungsten silicide layer pattern 206a The barrier layer pattern 208a may include a nitride, for example, tungsten nitride, titanium nitride, tantalum nitride, boron nitride, etc. The metal wiring may include a metal layer pattern 210a formed on the barrier layer pattern 208a to at least partially fill the contact hole. The metal layer pattern 210a may correspond to the conductive layer pattern and may include tungsten.

Figure 7:
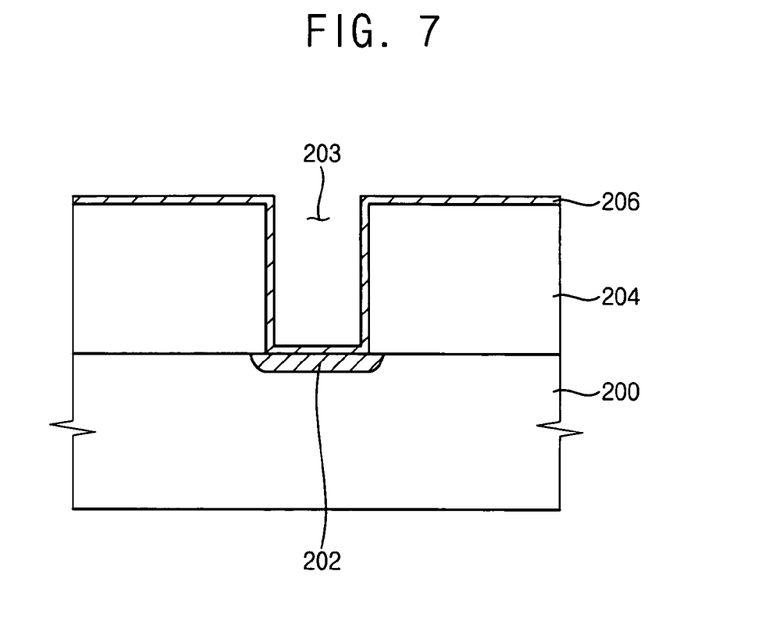
FIGS. 7 and 8 are cross-sectional views illustrating a method of forming a metal wiring in accordance with an example embodiment of the present invention.
Figure 8:
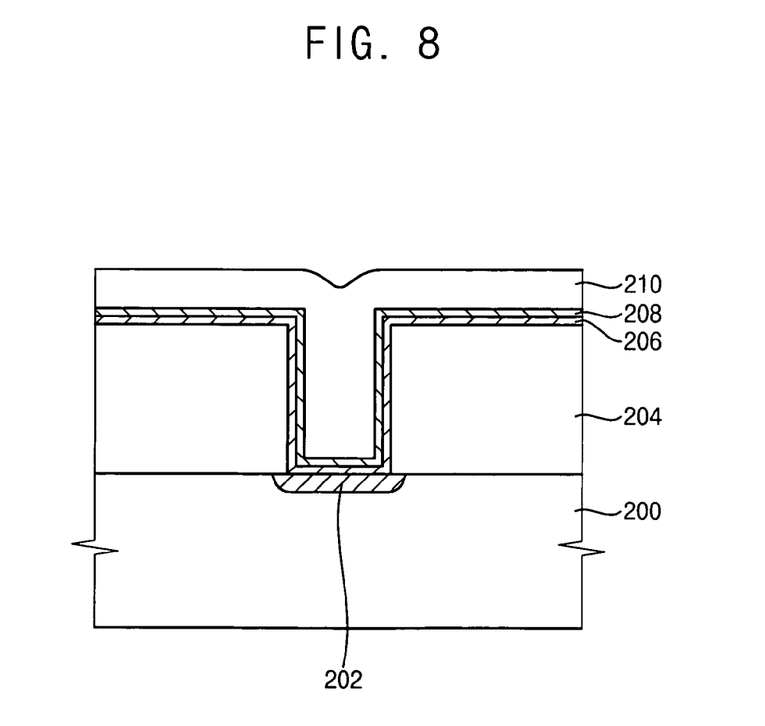

FIGS. 7 and 8 are cross-sectional views illustrating a method of forming a metal wiring in accordance with an example embodiment of the present invention.

Referring to FIG. 7, an insulation layer 204 and/or an insulating interlayer may be formed on a substrate 200. A lower structure may be formed between the substrate 200 and the insulation layer 204. The lower structure may include a contact region, a pad, a plug, a conductive pattern and/or a transistor.

The insulation layer 204 may be partially etched to form a contact hole 203 that exposes a portion of the substrate 200 and/or the lower structure.

A tungsten silicide layer 206 may be formed on a sidewall, a bottom face of the contact hole 203, and/or on the insulation layer 204. The tungsten silicide layer 206 may include tungsten and silicon with an atomic ratio of about 1:5 to about 1:15. The tungsten silicide layer 206 may have a thickness of about 30 Å to about 200 Å measured from an upper face of the insulation layer 204. The tungsten silicide layer 206 may be formed by a process substantially the same as the process described with reference to FIG. 3.

Referring to FIG. 8, a barrier layer 208 may be formed on the tungsten silicide layer 206. The barrier layer 208 may be formed using a nitride, for example, tungsten nitride, titanium nitride, tantalum nitride, boron nitride, etc.

As shown in FIG. 8, a metal layer 210 may be formed on the barrier layer 208 to at least partially fill the contact hole 203. The metal layer 210 may be formed using tungsten.

The metal layer 210, the barrier layer 208 and the tungsten silicide layer 206 may be partially removed until the insulation layer 204 is exposed to subsequently form a tungsten silicide layer pattern, a barrier layer pattern and a metal layer pattern. The metal layer 210, the barrier layer 208 and the tungsten silicide layer 206 may be partially removed by a chemical mechanical polishing (CMP) process, an etch-back process or a combination process of CMP and etch-back.

Hereinafter, various Examples and Comparative Examples of transistors illustrating the teachings of the present invention will be described.

Example 1

A transistor of Example 1 included a gate insulation layer formed on a substrate. The transistor further included a gate structure that had a polysilicon layer pattern doped with P type impurities, a tungsten silicide layer pattern, a barrier layer pattern, a metal layer pattern and a hard mask pattern sequentially formed on the gate insulation layer. Here, the tungsten silicide layer pattern included tungsten and silicon with an atomic ratio of about 1:5. The transistor included source/drain regions formed at portions of the substrate adjacent to the gate structure. The source/drain regions were doped with P type impurities.

Example 2

A transistor of Example 2 had a gate insulation layer formed on a substrate. The transistor included a gate structure that had a polysilicon layer pattern doped with P type impurities, a tungsten silicide layer pattern, a barrier layer pattern, a metal layer pattern and a hard mask pattern sequentially formed on the gate insulation layer. Here, the tungsten silicide layer pattern included tungsten and silicon with an atomic ratio of about 1:7. The transistor further included source/drain regions formed at portions of the substrate adjacent to the gate structure. The source/drain regions were doped with P type impurities.

Example 3

A transistor of Example 3 had a gate insulation layer formed on a substrate. The transistor included a gate structure that had a polysilicon layer pattern doped with P type impurities, a tungsten silicide layer pattern, a barrier layer pattern, a metal layer pattern and a hard mask pattern sequentially formed on the gate insulation layer. Here, the tungsten silicide layer pattern included tungsten and silicon with an atomic ratio of about 1:8. The transistor further included source/drain regions formed at portions of the substrate adjacent to the gate structure. The source/drain regions were doped with P type impurities.

Example 4

A transistor of Example 4 had a gate insulation layer formed on a substrate. The transistor included a gate structure that had a polysilicon layer pattern doped with N type impurities, a tungsten silicide layer pattern, a barrier layer pattern, a metal layer pattern and a hard mask pattern sequentially formed on the gate insulation layer. Here, the tungsten silicide layer pattern included tungsten and silicon with an atomic ratio of about 1:5. The transistor further included source/drain regions formed at portions of the substrate adjacent to the gate structure. The source/drain regions were doped with N type impurities.

Example 5

A transistor of Example 5 had a gate insulation layer formed on a substrate. The transistor included a gate structure that had a polysilicon layer pattern doped with N type impurities, a tungsten silicide layer pattern, a barrier layer pattern, a metal layer pattern and a hard mask pattern sequentially formed on the gate insulation layer. Here, the tungsten silicide layer pattern included tungsten and silicon with an atomic ratio of about 1:7. The transistor further included source/drain regions formed at portions of the substrate adjacent to the gate structure. The source/drain regions were doped with N type impurities.

Example 6

A transistor of Example 6 included a gate insulation layer formed on a substrate. The transistor had a gate structure that had a polysilicon layer pattern doped with N type impurities, a tungsten silicide layer pattern, a barrier layer pattern, a metal layer pattern and a hard mask pattern sequentially formed on the gate insulation layer. Here, the tungsten silicide layer pattern included tungsten and silicon with an atomic ratio of about 1:8. The transistor further included source/drain regions formed at portions of the substrate adjacent to the gate structure. The source/drain regions were doped with N type impurities.

Comparative Example 1

A transistor of Comparative Example 1 included a gate insulation layer formed on a substrate. The transistor had a gate structure that had a polysilicon layer pattern doped with P type impurities, a tungsten silicide layer pattern, a barrier layer pattern, a metal layer pattern and a hard mask pattern sequentially formed on the gate insulation layer. Here, the tungsten silicide layer pattern included tungsten and silicon with an atomic ratio of about 1:3. The transistor further included source/drain regions formed at portions of the substrate adjacent to the gate structure. The source/drain regions were doped with P type impurities.

Comparative Example 2

A transistor of Comparative Example 2 had a gate insulation layer formed on a substrate. The transistor included a gate structure that had a polysilicon layer pattern doped with N type impurities, a tungsten silicide layer pattern, a barrier layer pattern, a metal layer pattern and a hard mask pattern sequentially formed on the gate insulation layer. Here, the tungsten silicide layer pattern included tungsten and silicon with an atomic ratio of about 1:3. The transistor further included source/drain regions formed at portions of the substrate adjacent to the gate structure. The source/drain regions were doped with N type impurities.

Evaluation of Profiles of Transistors According to Examples 1 and 2 and Comparative Example 1

Figure 9:
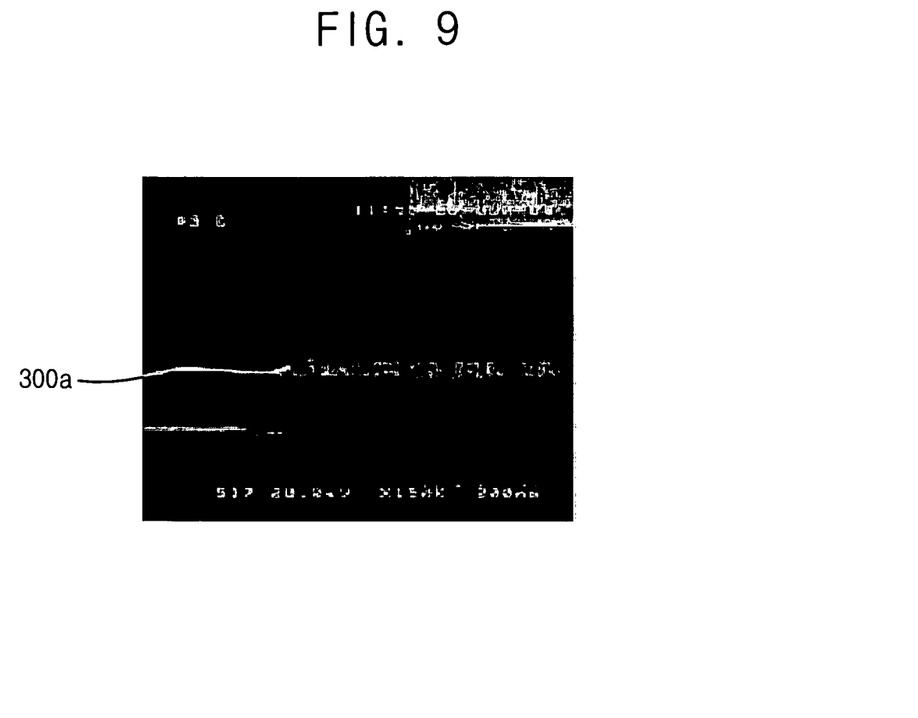
FIGS. 9 and 10 are electron microscopic photographs showing gate structures according to Examples 1 and 2.
Figure 10:
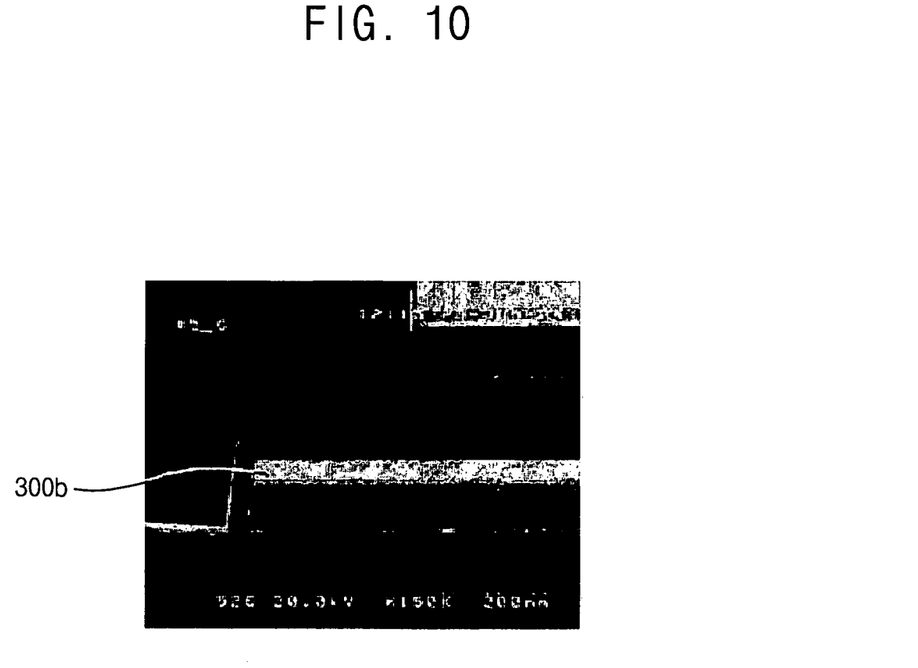
Figure 11:
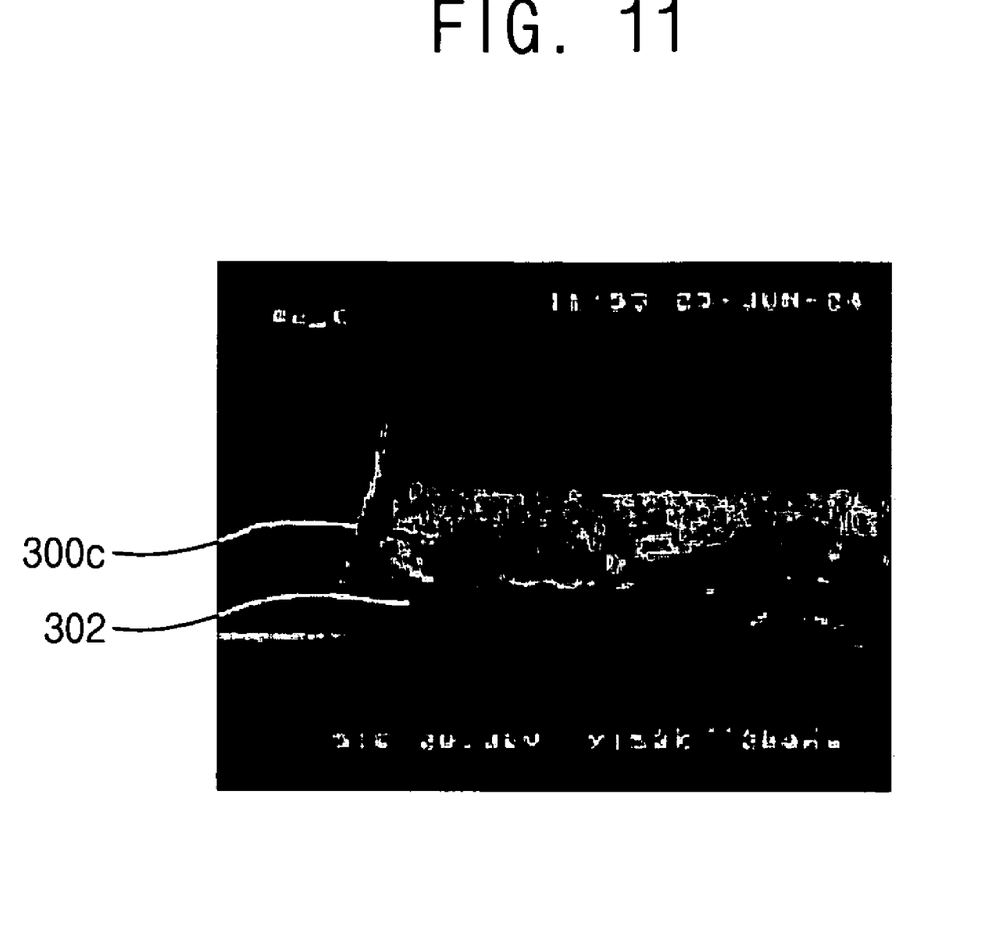
FIG. 11 is an electron microscopic photograph showing a gate structure according to Comparative Example 1.

FIGS. 9 and 10 are electron microscopic photographs showing gate structures according to Examples 1 and 2. FIG. 11 is an electron microscopic photograph showing a gate structure according to Comparative Example 1. In FIGS. 9 to 11, the electron microscopic photographs were obtained using a scanning electronic microscope (SEM).

Referring to FIGS. 9 and 10 corresponding to Examples 1 and 2 respectively, tungsten layer patterns remained on tungsten silicide layer patterns 300a and 300b. After forming the tungsten layer patterns, each of the tungsten silicide layers 300a and 300b has a thickness substantially the same as an initial thickness thereof.

However, as shown in FIG. 11 corresponding to Comparative Example 1, a tungsten layer pattern formed on a tungsten silicide layer pattern 300c was silicided. When the tungsten layer pattern was silicided, a volume of the tungsten layer pattern was reduced so that a void 302 was generated adjacent to an interface between a polysilicon layer pattern and the tungsten silicide layer pattern 300c. Further, the thickness of the tungsten silicide layer pattern 300c increased substantially when the tungsten silicide layer pattern 300c was silicided. The thickness of the polysilicon layer pattern decreased by about 50 percent of an initial thickness thereof as a result of a silicidation reaction between the tungsten layer pattern and the polysilicon layer pattern.

Evaluation of Electrical Characteristics of Transistors According to Examples 1 to 6 and Comparative Examples 1 and 2

Resistances of gate structures in the transistors of Examples 1 to 6 and Comparative Examples 1 and 2 were measured. The measured resistances are shown in the following Tables 1 and 2.

TABLE 1

|  | Example 1 | Example 2 | Example 3 | Comparative Example 1 |
| --- | --- | --- | --- | --- |
| Resistance of Gate Structure [Ω] | $1.8 \times 10^5$ | $6.0 \times 10^4$ | $1.7 \times 10^4$ | Impossible to measure |

TABLE 2

|  | Example 4 | Example 5 | Example 6 | Comparative Example 2 |
| --- | --- | --- | --- | --- |
| Resistance of Gate Structure [Ω] | $2.3 \times 10^5$ | $6.1 \times 10^4$ | $3.4 \times 10^4$ | Impossible to measure |

Additionally, resistance of the tungsten silicide layer patterns in the gate structures of Examples 1 to 6 and Comparative Examples 1 and 2 were measured. The measured specific resistances are shown in the following Table 3.

TABLE 3

|  | Specific Resistance of Tungsten Silicide Layer Pattern [μΩcm] |
| --- | --- |
| Examples 1 and 5 | About 53,000 |
| Examples 2 and 4 | About 16,000 |
| Examples 3 and 6 | About 8,000 |
| Comparative Examples 1 and 2 | About 2,000 |

As shown in Tables 1 and 2, the resistance of the gate structures of the transistors decreased as the content of silicon in the tungsten silicide layer patterns was increased. Particularly, the resistance of the gate structures according to Example 3 and 6 were relatively small because each of the tungsten silicide layer patterns of Examples 3 and 6 included tungsten and silicon by the atomic ratio of about 1:8.

In the Comparative Examples 1 and 2, since the tungsten layer patterns of the gate structures were partially silicided, the resistance of the gate electrodes measured at different regions was considerably different from one another. Thus, the gate structures according to Comparative Examples 1 and 2 did not show exact resistances.

As shown in Table 3, the resistances of the gate structures were reduced according as the specific resistances of the tungsten silicide layer patterns were decreased.

As described above, the profile and the electrical characteristics of the gate structure may depend heavily on the composition of a tungsten silicide layer pattern disposed between a polysilicon layer pattern and a metal layer pattern as an ohmic layer pattern. For example, when a tungsten silicide layer pattern includes tungsten and silicon by the atomic ratio in a range of about 1:5 to about 1.0:15.0, a gate structure of a transistor may have a substantially reduced resistance.

According to example embodiments of the present invention, a tungsten silicide layer and/or a tungsten silicide layer pattern may be used as an ohmic layer and/or an ohmic layer pattern in a conductive structure, for example, a gate structure of a transistor or a metal wiring in a semiconductor device. Accordingly, a gate structure or the metal wiring including an ohmic layer and/or ohmic layer pattern may have a greatly reduced resistance. As a result, a transistor and/or a semiconductor device may have improved response speeds and enhanced reliability.

The foregoing description of example embodiments is illustrative of the present invention and is not to be construed as limiting thereof. Although a few example embodiments of this invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A method of forming an ohmic layer in a semiconductor device comprising:
   forming a first conductive layer;
   forming a tungsten silicide layer on a substrate, wherein the tungsten silicide layer including tungsten and silicon with an atomic ratio within a range of about 1:5 to about 1:15;
   forming a barrier layer on the tungsten silicide layer; and
   forming a tungsten layer on the barrier layer,
   wherein the tungsten silicide layer prevents a silicidation of the tungsten layer during a thermal process performed at a temperature higher than about 800° C., so that the tungsten silicide layer reduces a contact resistance between the first conductive layer and the tungsten layer.

2. The method of claim 1, wherein forming the tungsten silicide layer includes using a reaction gas including a tungsten source gas and a silicon source gas by a partial pressure ratio within a range of about 1.0:25.0 to about 1.0:160.0, the reaction gas having a partial pressure within a range of about 2.05 percent to about 30.0 percent of a total internal pressure of the chamber.

3. The method of claim 2, wherein forming the tungsten silicide layer further includes introducing an inert gas into the chamber.

4. The method of claim 3, wherein the inert gas has a partial pressure within a range of about 70 percent to about 97.95 percent of the total internal pressure of the chamber.

5. The method of claim 2, wherein the tungsten source gas includes tungsten fluoride (WF6) and the silicon source gas includes dichlorosilane (SiH2Cl2) or silane (SiH4).

6. The method of claim 2, wherein the total internal pressure of the chamber is within a range of about 0.5 Torr to about 5.0 Torr.

7. The method of claim 1, wherein forming the tungsten silicide layer includes performing a sputtering process using a target that includes the tungsten and the silicon with an atomic ratio within a range of about 1:5 to about 1:15.

8. A method of forming a gate structure of a transistor comprising:
   forming a first conductive layer on a substrate;
   forming a tungsten silicide layer on the first conductive layer serving as an ohmic layer, the tungsten silicide layer including tungsten and silicon with an atomic ratio within a range of about 1:5 to about 1:15;
   forming a barrier layer on the tungsten silicide layer;
   forming a tungsten layer on the barrier layer; and
   etching the tungsten layer, the barrier layer, the tungsten silicide layer and the first conductive layer to form a conductive structure including a first conductive layer pattern, a tungsten silicide layer pattern, a barrier layer pattern, and a tungsten layer pattern on the substrate, respectively,
   wherein the tungsten silicide layer pattern prevents a silicidation of the tungsten layer pattern during a thermal process performed at a temperature higher than about 800° C., so that the tungsten silicide layer pattern reduces a contact resistance between the first conductive layer pattern and the tungsten layer pattern.

9. The method of claim 8, wherein the tungsten silicide layer pattern has a thickness within a range of about 30 Å to about 200 Å.

10. The method of claim 8, wherein forming the tungsten silicide layer includes using a reaction gas including a tungsten source gas and a silicon source gas by a partial pressure ratio within a range of about 1.0:25.0 to about 1.0:160.0, the reaction gas having a partial pressure within a range of about 2.05 percent to about 30.0 percent of a total internal pressure of a chamber.

11. The method of claim 10, wherein forming the tungsten silicide layer further includes introducing an inert gas into the chamber.

12. The method of claim 11, wherein the inert gas has a partial pressure within a range of about 70 percent to about 97.95 percent of the total internal pressure of the chamber.

13. The method of claim 10, the tungsten source gas includes tungsten fluoride (WF6) and the silicon source gas includes dichlorosilane (SiH2Cl2) or silane (SiH4).

14. The method of claim 10, wherein the total internal pressure of the chamber is within a range of about 0.5 Torr to about 5.0 Torr.

15. The method of claim 8, wherein forming the tungsten silicide layer includes performing a sputtering process using a target that includes tungsten and silicon with an atomic ratio within a range of about 1:5 to about 1:15.

16. The method of claim 8, wherein forming the first conductive layer includes using undoped polysilicon or polysilicon doped with N type impurities or P type impurities.

17. The method of claim 8, wherein forming the barrier layer includes using tungsten nitride, titanium nitride, tantalum nitride or boron nitride.

18. A method of forming a metal wiring comprising:
   forming an insulation layer;
   forming a tungsten silicide layer pattern on a sidewall and a bottom face of a contact hole formed through the insulation layer, an tungsten silicide layer pattern including tungsten and silicon with an atomic ratio within a range of about 1:5 to about 1:15;
   forming a barrier layer pattern on the tungsten silicide layer pattern; and
   forming a conductive layer pattern on the barrier layer pattern to at least partially fill the contact hole using tungsten,
   wherein the tungsten silicide layer pattern is formed using a reaction gas including a tungsten source gas and a silicon source gas by a partial pressure ratio within a range of about 1.0:25.0 to about 1.0:160.0 and the reaction gas has a partial pressure within a range of about 2.05 percent to about 30.0 percent of a total internal pressure of a chamber and wherein the tungsten silicide layer pattern prevents a silicidation of the tungsten layer pattern during a thermal process performed at a temperature higher than about 800° C.

19. A method of forming a gate structure of a transistor comprising:
   forming a polysilicon layer on a substrate;
   forming a tungsten silicide layer on the polysilicon layer using a reaction gas including a tungsten source gas and a silicon source gas by a partial pressure ratio within a range of about 1.0:25.0 to about 1.0:160.0, the reaction gas having a partial pressure within a range of about 2.05 percent to about 30.0 percent of a total internal pressure of the chamber and the tungsten silicide layer including tungsten and silicon with an atomic ratio within a range of about 1:5 to about 1:15;
   forming a barrier layer on the tungsten silicide layer;
   forming a tungsten layer on the barrier layer; and
   etching the tungsten layer, the barrier layer, the tungsten silicide layer and the polysilicon layer to form a conductive structure including a polysilicon layer pattern, a barrier layer pattern, a tungsten silicide layer pattern, and a tungsten layer pattern on the substrate, respectively, wherein the tungsten silicide layer pattern prevents a silicidation of the tungsten layer pattern during a thermal process performed at a temperature higher than about 800° C., so that the tungsten silicide layer pattern reduces a contact resistance between the polysilicon layer pattern and the tungsten layer pattern.

20. The method of claim 19, wherein the tungsten silicide layer pattern has a specific resistance in a range of about 8,000 μΩcm to about 53,000 μΩcm.

* * * * *